United States Patent
Park et al.

(10) Patent No.: US 9,330,345 B2
(45) Date of Patent: May 3, 2016

(54) MEMORY CARD AND MEMORY CARD ADAPTOR

(71) Applicant: SAMSUNG ELECTRONICS CO., LTD., Suwon-Si, Gyeonggi-Do (KR)

(72) Inventors: Young-Jin Park, Incheon (KR); Il-Guy Jung, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 49 days.

(21) Appl. No.: 14/056,984

(22) Filed: Oct. 18, 2013

(65) Prior Publication Data

US 2014/0113460 A1   Apr. 24, 2014

(30) Foreign Application Priority Data

Oct. 18, 2012   (KR) ......................... 10-2012-0115790

(51) Int. Cl.
| | |
|---|---|
| *G06K 13/08* | (2006.01) |
| *G06K 19/077* | (2006.01) |
| *H01R 13/62* | (2006.01) |
| *H01R 13/639* | (2006.01) |
| *H01R 13/64* | (2006.01) |
| *H01R 12/70* | (2011.01) |
| *H01R 12/79* | (2011.01) |
| *H01R 13/24* | (2006.01) |

(52) U.S. Cl.
CPC .......... *G06K 13/085* (2013.01); *G06K 13/0856* (2013.01); *G06K 19/07741* (2013.01); *G06K 19/07743* (2013.01); *H01L 2924/00* (2013.01); *H01R 12/7005* (2013.01); *H01R 12/7011* (2013.01); *H01R 12/79* (2013.01); *H01R 13/2421* (2013.01); *H01R 13/6205* (2013.01); *H01R 13/639* (2013.01); *H01R 13/64* (2013.01); *H05K 2201/10159* (2013.01)

(58) Field of Classification Search
CPC ........... H01R 13/6205; H01R 13/2421; H01R 13/64; H01R 12/7005; H01R 12/79; H01R 13/639; H01R 12/7011; H01L 2924/00; H05K 2201/10159
USPC .............................. 439/39, 328, 630; 361/737
See application file for complete search history.

(56) References Cited

U.S. PATENT DOCUMENTS

| | | | | |
|---|---|---|---|---|
| 6,109,929 | A | * | 8/2000 | Jasper ..................... G06F 1/184 361/790 |
| 7,300,314 | B2 | | 11/2007 | Kim |

(Continued)

FOREIGN PATENT DOCUMENTS

| | | |
|---|---|---|
| KR | 00334351 | 2/2004 |
| KR | 0565778 | 3/2006 |

(Continued)

*Primary Examiner* — Abdullah Riyami
*Assistant Examiner* — Justin Kratt
(74) *Attorney, Agent, or Firm* — Volentine & Whitt, PLLC

(57) ABSTRACT

A memory card includes a card body, an interface terminal and an attachment mechanism for detachably mounting the card to an adaptor of an electronic device. The interface terminal is disposed at a central portion of a major surface of the card body. The attachment mechanism is located at an outer peripheral portion of the card body that surrounds the central portion. The adaptor has a recess whose shape complements that of the major surface of the card body, and socket exposed at a central portion of the bottom of the recess. Thus, the memory card may be inserted face down into the adaptor.

18 Claims, 12 Drawing Sheets

(56) References Cited

U.S. PATENT DOCUMENTS

| | | |
|---|---|---|
| 7,672,691 B2 | 3/2010 | Kim et al. |
| 7,909,251 B2 | 3/2011 | Yi et al. |
| 2005/0159035 A1 | 7/2005 | Shih |
| 2009/0323294 A1* | 12/2009 | Moon ................ H05K 1/0286 361/737 |

FOREIGN PATENT DOCUMENTS

| | | |
|---|---|---|
| KR | 0587305 | 5/2006 |
| KR | 0608832 | 7/2006 |
| KR | 20090089706 | 8/2009 |
| KR | 20110010761 | 11/2011 |
| KR | 1113512 | 1/2012 |

* cited by examiner

MEMORY CARD AND MEMORY CARD ADAPTOR

PRIORITY STATEMENT

This application claims priority under 35 USC §119 to Korean Patent Application No. 2012-115790, filed on Oct. 18, 2012 in the Korean Intellectual Property Office (KIPO), the contents of which are hereby incorporated by reference in their entirety.

BACKGROUND

1. Field

The inventive concept relates to a memory card and to a memory card adaptor. More particularly, the inventive concept relates to a memory card used in an electronic device such as a cellular phone, and to a memory card adaptor integrated with the device to receive the memory card and electrically couple the memory card to the device.

2. Description of the Related Art

A memory card may be used to expand the memory of a cellular phone or the like. Accordingly, some cellular phones are provided with adaptors configured to receive a memory card.

In general, the adaptor requires the memory card to be inserted into the cellular phone in a horizontal direction (i.e., parallel to the major surfaces of the body of the card). Moreover, the battery of the cellular phone must be detached from the cellular phone before the memory card can be inserted into the adaptor. At this time, particles such as dust can infiltrate the adaptor.

Furthermore, the adaptor is configured to receive only one memory card. Thus, cellular phones may be provided with a number of adaptors for receiving a corresponding number of memory cards so as to allow for a greater flexibility in expanding their memories. Obviously, this can cause a cellular phone to incur increased costs in its manufacture.

Furthermore, an interface terminal of the memory card must contact a socket of the adaptor when the memory card is received by the adaptor. Therefore, the memory card has to be inserted into the adaptor in a specific direction. That is, the memory card has "directivity". This can allow the memory card to be inserted incorrectly into the adaptor.

SUMMARY

According to an aspect of the inventive concept, there is provided a memory card comprising: a card body containing an electronic memory of the card, an interface terminal electrically connected to the memory, and an attachment mechanism by which the card is to be detachably connected to an electronic device, and in which the card body has first and second oppositely facing major surfaces and an outer peripheral side edge, the interface terminal is exposed at a central portion of the first major surface of the card body, and the attachment mechanism is disposed at an outer peripheral portion of the first major surface of the card body that surrounds the central portion.

According to another aspect of the inventive concept, there is provided a memory card adaptor comprising: an adaptor body having an upper surface and a card-receiving recess in the upper surface, a lock integral with the adaptor body and adapted to lock a memory card to the adaptor body, and an electrical socket, and in which the card-receiving recess is configured to receive a memory card face down, and the electrical socket is exposed at a central portion of a surface of the adaptor body that defines the bottom of the card-receiving recess and is adapted to electrically conductively contact an interface terminal of a memory card received in the recess.

According to the inventive concept there is also provided the combination of an electronic device that employs the adaptor, and at least one memory card disposed face down and detachably secured to the adaptor. The memory card thus has a card body containing an electronic memory of the card, an interface terminal electrically connected to the electronic memory, and an attachment mechanism. The card body has first and second oppositely facing major surfaces and an outer peripheral side. The interface terminal is exposed at a central portion of the first major surface of the card body. And the attachment mechanism is disposed at an outer peripheral portion of the first major surface of the card body that surrounds the central portion. The memory card adaptor comprises an adaptor body having an upper surface and a card-receiving recess in the upper surface, an electrical socket exposed at a central portion of a surface of the adaptor body that defines the bottom of the card-receiving recess, and a lock integral with the adaptor body and disposed at an outer peripheral portion of the upper surface of the adaptor body that defines the bottom of the card-receiving recess. The card-receiving recess has a cross-sectional shape corresponding to the shape of the first major surface of the card body of the memory card, and the memory card is received in the card-receiving recess with the first major surface of the card body facing the bottom of the card-receiving recess. The lock of the adaptor and the attachment mechanism of the memory card coact to detachably secure the memory card to the adaptor body within the card-receiving recess, and the socket electrically conductively contacts the interface terminal of memory card.

BRIEF DESCRIPTION OF THE DRAWINGS

The inventive concept will be more clearly understood from the following detailed description of preferred embodiments thereof made in conjunction with the accompanying drawings, of which.

DETAILED DESCRIPTION OF THE PREFERRED EMBODIMENTS

Figure 1:
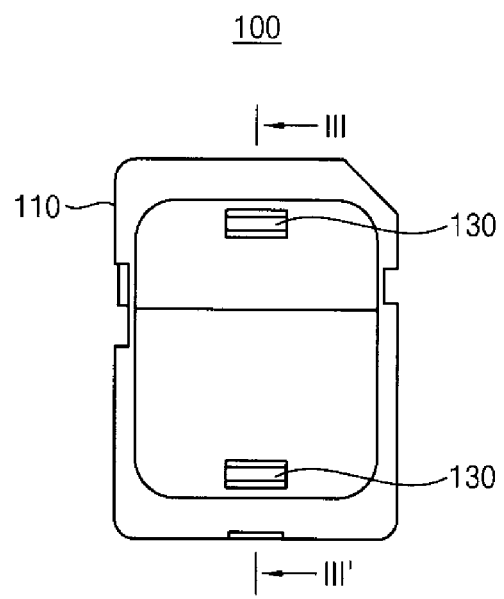
FIG. 1 is a top view of an embodiment of a memory card in accordance with the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper" and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "upper" or "bottom" as used to describe a surface generally refer not only to the orientation depicted in the drawings but to the fact that the surface is the uppermost or bottommost surface in the orientation depicted, as would be clear from the drawings and context of the written description.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

Memory Card

An embodiment of a memory card in accordance with the inventive concept will now be described in detail with reference to FIGS. 1 to 3. The embodiment of this memory card includes a card body 110, an electronic memory (e.g., an IC comprising memory cells) contained in the card body, an interface terminal 120 and an attachment mechanism.

The memory card 100 may be used as an external hard drive of an electronic device such as a cellular phone, a notebook, etc. Thus, the memory card 100 may be embodied as a secure digital (SD) card. Also, the device may have an adaptor configured to receive the memory card 100. In this case, the adaptor (described later on in more detail with reference to FIGS. 18 and 19) includes a socket configured to electrically conductively engage (contact) the interface terminal 120 of the memory card 100.

In the illustrated example of this embodiment, the card body 110 has a rectangular cross section. Thus, the card body 110 may have a first major surface, a second major surface opposite to the first surface, and four side surfaces. The first major surface may constitute a lower surface of the card body 110. The second major surface may constitute an upper surface of the card body 110. The four side surfaces constitute the outer peripheral side edge of the card body The interface terminal 120 is arranged on the first surface of the card body 110. Thus, the interface terminal 120 may be oriented toward the adaptor as the memory card is being inserted into the adaptor. Also, in this embodiment, the interface terminal 120 is located at a central portion of the first surface of the card body 110 and comprises a plurality of electrical contacts. These contacts are electrically connected (by vias) to the electronic memory housed in the card body 110. The socket may be located on a bottom surface of the adaptor corresponding to the position of the interface terminal 120. Because the interface terminal 120 is disposed on the first surface of the card body 110, the memory card 100 may be inserted into the adaptor in a vertical direction. Therefore, in the case in which the memory card 100 is used to expand the memory of a cellular phone, the memory card 100 may be readily inserted into the adaptor of the cellular phone without removing the battery of the phone.

The attachment mechanism fixes the card body 110 to the adaptor. In this embodiment, the attachment mechanism comprises a magnet 130. The magnet may be disposed at an outer peripheral portion of the card body 110. In the illustrated example of this embodiment, the attachment mechanism is a pair of magnets 130 symmetrically arranged with respect to the interface terminal 120. In this case, the magnets 130 may be disposed at central portions of opposite sides of the card body 110. Furthermore, the magnets 130 may have an N pole and an S pole opposite to each other and may extend vertically through the card body 110 such that like poles of the magnets are located on each of the first and second major surfaces.

The adaptor has a lock to which the magnet(s) 130 is/are magnetically attracted. The lock may comprise a magnet(s) similar to the magnet(s) 130. For example, when the N pole of the magnet 130 is oriented toward the adaptor, the lock may be a magnet whose S pole is oriented toward the card body 110 received by the adaptor such that memory card 100 is firmly fixed to the adaptor by an attractive force between the N pole of the magnet 130 and the S pole of the lock and yet, the memory card 100 may be readily detached from the adaptor by simply pulling the memory card 100 from the adaptor.

Figure 4:
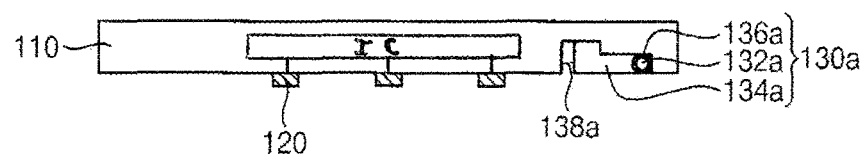
FIGS. 4 and 5 are cross-sectional views of another embodiment of a memory card in accordance with the inventive concept.
Figure 5:
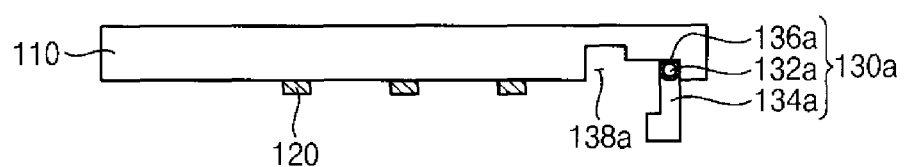

Another embodiment of a memory card in accordance with the inventive concept is illustrated in FIGS. 4 and 5.

Figure 2:
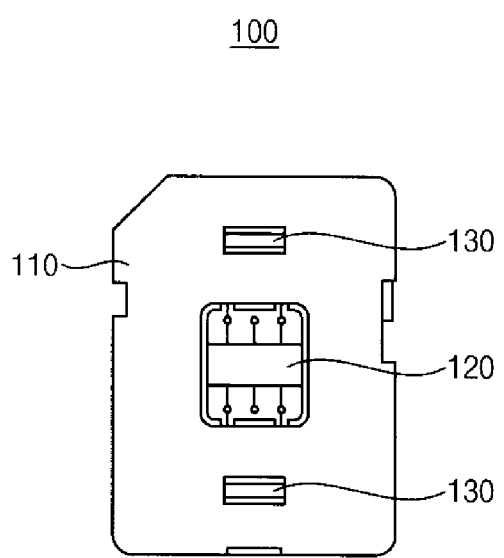
FIG. 2 is a bottom view of the memory card of FIG. 1.
Figure 3:
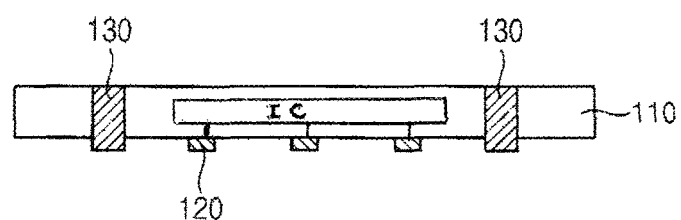
FIG. 3 is a cross-sectional view taken along a line III-III' in FIG. 1.

This embodiment of a memory card 100a has elements substantially the same as those of the memory card 100 of FIGS. 1-3 except with respect to the attachment mechanism. Thus, the elements of the memory card 100a which are similar to those of the memory card 100 will not be described again here for brevity.

The attachment mechanism of this embodiment is a mechanical attachment mechanism 130a that fixes the memory card 100a to the adaptor using a mechanical or physical force. In one example, the mechanical attachment mechanism 130a includes a hinge pin 132a, a latch 134a and a return spring 136a. The hinge pin 132a is connected to an outer peripheral portion of the card body 110. The latch 134a is mounted to the hinge pin 132a so that the latch 134a may rotate about the central longitudinal axis of the hinge pin 132a (with the hinge pin 132a in a case in which the hinge pin 132a is mounted so as to be rotatable relative to the card body 110 and latch 132 is fixed to the hinge pin 132a).

Furthermore, the latch 134a may be received in a groove 138a formed in the first surface of the card body 110. In the illustrated example as shown in FIG. 5, when the hinge pin 132a is rotated in a clockwise direction, a lower end of the latch 134a protrudes from the first surface of the card body 110. The lower end of the latch 134a may be inserted into a locking groove of the adaptor and engaged with part of the adaptor to fix the memory card 100a to the adaptor.

The return spring 136a is provided to bias the hinge pin 132a (and/or latch 134a) in the counterclockwise (closed) direction so that once the latch 134a is inserted into the locking groove of the adaptor, the latch 134a is urged back into the receiving groove 138a of the card body 110 where it engages part of the adaptor. To this end, the return spring 136a may be a torsion spring for exerting torque on the hinge pin 132a.

Figure 6:
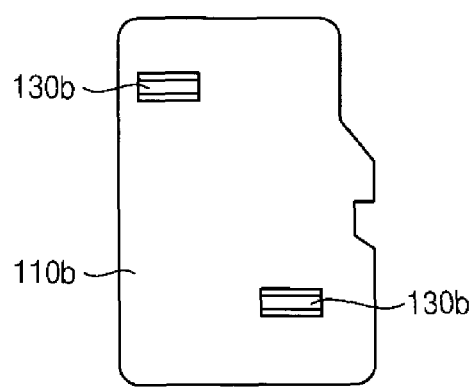
FIG. 6 is a top view of another embodiment of a memory card in accordance with the inventive concept.
Figure 7:
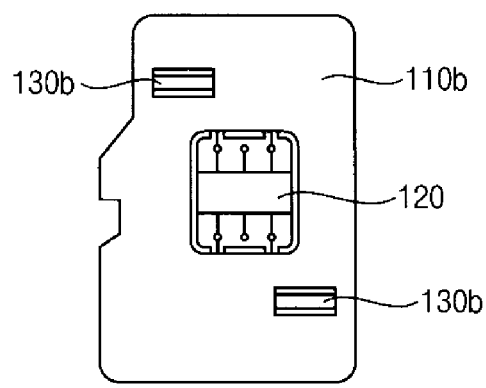
FIG. 7 is a bottom view of the memory card of FIG. 6.

Another example a memory card 100b in accordance with the inventive concept is illustrated in FIGS. 6 and 7. The elements of the memory card 100b which are similar to those of the memory card 100 will not be described again here for brevity.

The memory card 100b has a card body 110b which is smaller than (has a smaller area or footprint than that of) the card body 110. In this respect, the memory card 100b may be what is referred as a micro memory card.

The attachment mechanism of the memory card 100b in this example comprises fixing members 130b lying along a diagonal of the card body 110b as spaced from each other. Each of the fixing members 130b may thus be located at opposite corners of the card body 110b. Furthermore, the fixing members 130b may be magnets as in the embodiment of FIG. 1, or the attachment mechanism may comprise a mechanical attachment mechanism of the type shown in and described with reference to FIGS. 4 and 5.

Figure 8:
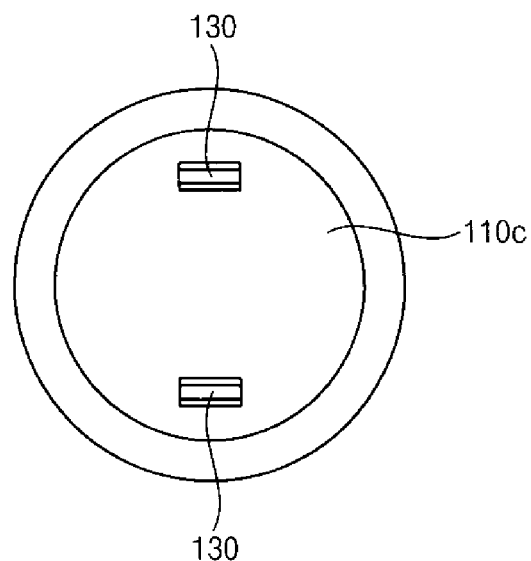
FIG. 8 is a top view of still another embodiment of a memory card in accordance with the inventive concept.
Figure 9:
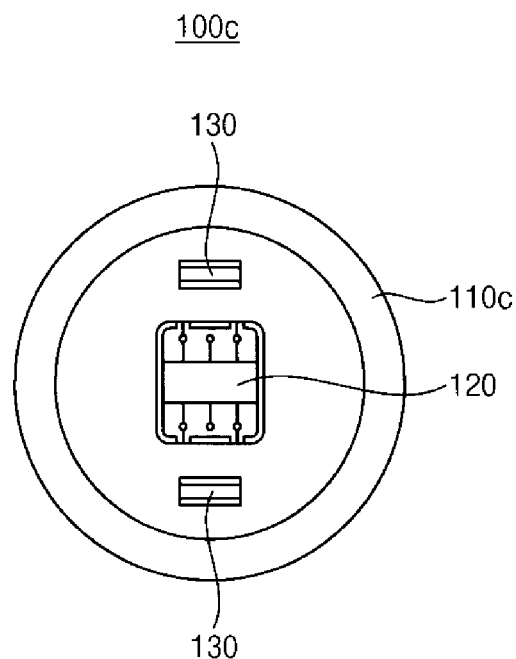
FIG. 9 is a bottom view of the memory card of FIG. 8.

Another embodiment of a memory card in accordance with the inventive concept is illustrated in FIGS. 8 and 9.

This embodiment of a memory card 100c is substantially the same as the memory card 100 of the embodiment of FIGS. 1-3 except for the shape of the card body. The card body 110c of this embodiment has a circular cross section and hence, the memory card 100c has a cylindrical form. Thus, the groove of the adaptor configured to receive the circular card body 110c also is cylindrical.

Therefore, the adaptor (described in more detail later on with reference to FIGS. 22 and 23) may allow the circular memory card 100c to be readily inserted therein without regard to the orientation of the memory card 100c in a plane parallel to the first and second major surfaces of the card 100c. Accordingly, the circular memory card 100c may lack "directivity" unlike the embodiments of the memory cards 100, 100a and 100b of FIGS. 1-7.

Furthermore, although FIGS. 8 and 9 illustrate an example in which the memory card 100c has an attachment mechanism in the form of magnets 130, the memory card 100c may instead have a mechanical attachment mechanism 130a of the type shown in and described with reference to FIGS. 4 and 5.

Figure 10:
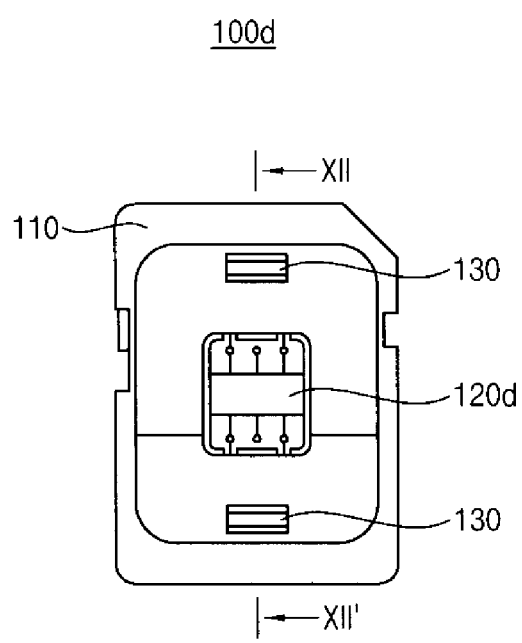
FIG. 10 is a top view of still another embodiment of a memory card in accordance with the inventive concept.
Figure 11:
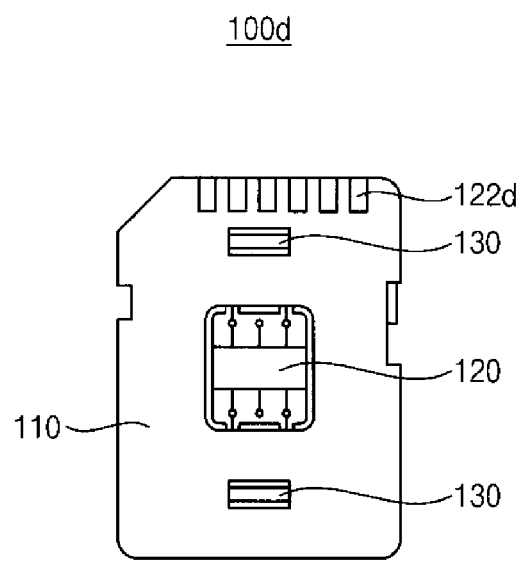
FIG. 11 is a bottom view of the memory card of FIG. 10.
Figure 12:
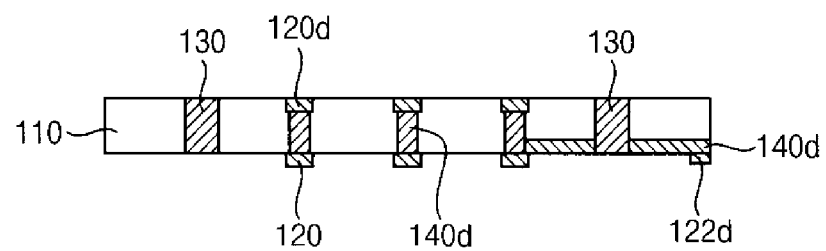
FIG. 12 is a cross-sectional view taken along line XII-XII' in FIG. 10.

Another embodiment of a memory card in accordance with the inventive concept is illustrated in FIGS. 10, 11 and 12.

Note, the electronic memory (e.g., IC comprising memory cells) of the card (see FIGS. 3 and 4) is not shown in these figures or the subsequent figures merely for ease of illustration.

Elements of the memory card 100d of this embodiment which are substantially the same as the memory card 100 of FIGS. 1-3 will not be described again here in detail for brevity.

The memory card 100d includes a second interface terminal 120d on a central portion of the second surface of the card body 110. Whereas the (first) interface terminal 120 electrically conductively contacts the socket of the adaptor, the second interface terminal 120d may electrically conductively contact an interface terminal of another memory card. That is, the memory card 100d of this embodiment facilitates a stacking of the memory cards in an adaptor of an electronic device (described in more detail later with reference to FIGS. 19 and 20). Thus, a cellular phone does not have to be provided with additional adaptors for receiving additional memory cards.

The interface terminal 120 and the second interface terminal 120d are electrically connected to each other via an electrical conductor 140d. The conductor 140d may extend vertically in the card body 110. In particular, the conductor 140d may have an upper end connected to the second interface terminal 120d, and a lower end connected to the interface terminal 120, i.e., the conductor 140d may comprise an electrically conductive via.

Additionally, the memory card 100d may have auxiliary interface terminals 122d at the outer periphery of the card body 110. The auxiliary interface terminals 122d allow the memory card 100d to be used with a conventional adaptor (having a socket on a side surface of its body). The auxiliary interface terminals 122d are electrically connected to the (first) interface terminal 120 and the second interface terminal 120d via conductors 140d (in this case, a conductive wiring pattern or "traces" at the first major surface of the card body 110).

Note, any of the embodiments of the memory cards 100, 100a, 100b and 100c of FIGS. 1-9 may be provided with the auxiliary interface terminals 122d and associated conductive wiring pattern.

Figure 13:
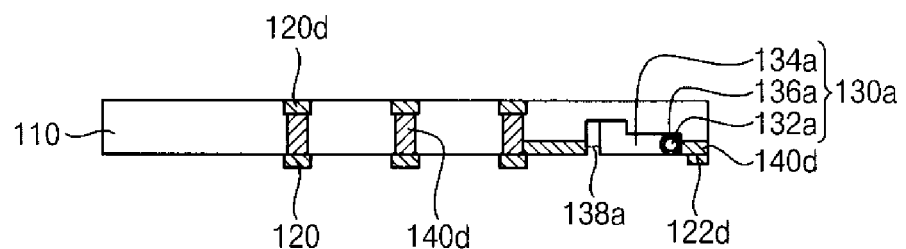
FIG. 13 is a cross-sectional view of still another embodiment of a memory card in accordance with the inventive concept.

Another embodiment of a memory card in accordance with the inventive concept is illustrated in FIG. 13.

The memory card 100e of this embodiment is substantially the same as that of the memory card 100d of FIG. 10 except for the attachment mechanism.

More specifically, the memory card 100e has a mechanical attachment mechanism 130a substantially the same as that of the embodiment of FIGS. 4-6. Thus, the attachment mechanism 130a includes a hinge pin 132a, latch 134a and return spring 136a. The latch 134a may be received in a groove 138a in the card body 110. Furthermore, and although not shown in FIG. 13, the card body 110 may have a locking groove in its second major (upper) surface, which will be described later on with reference to FIG. 22

Figure 14:
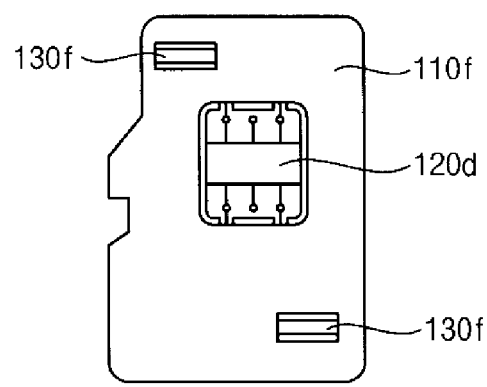
FIG. 14 is a top view of still another embodiment of a memory card in accordance with the inventive concept.
Figure 15:
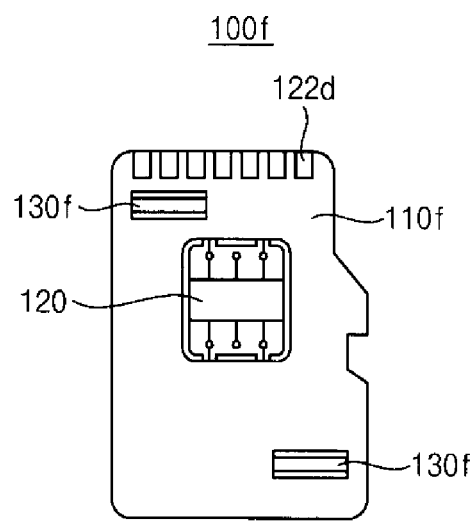
FIG. 15 is a bottom view of the memory card of FIG. 14.

Still another embodiment of a memory card in accordance with the inventive concept is illustrated in FIG. 14 and FIG. 15.

This embodiment of a memory card 100f is substantially the same as that of the memory card 100d of FIGS. 10-12 except for the size of a card body and the attachment mechanism.

More specifically, the memory card 100f may be embodied as a micro memory card.

Furthermore, the attachment mechanism may be a pair of magnets 130f disposed along a diagonal at diametrically opposed corners of the card body 110f. Alternatively, the attachment mechanism may be a mechanical attachment mechanism 130a of the type shown in and described with reference to FIGS. 4-6.

Figure 16:
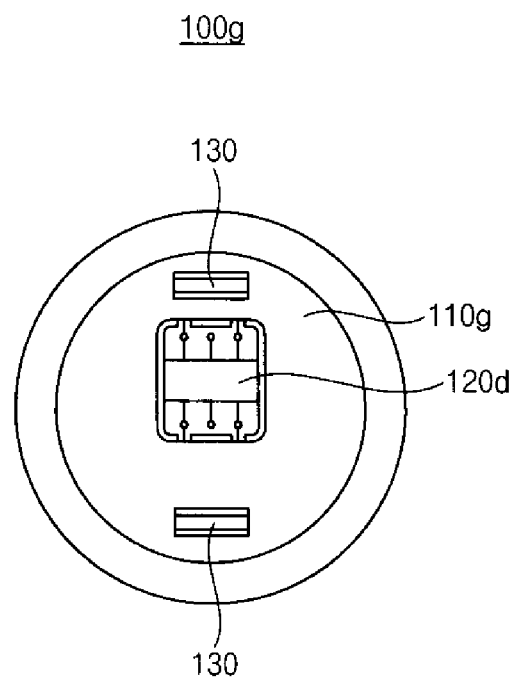
FIG. 16 is a plan view still another embodiment of a memory card in accordance with the inventive concept.
Figure 17:
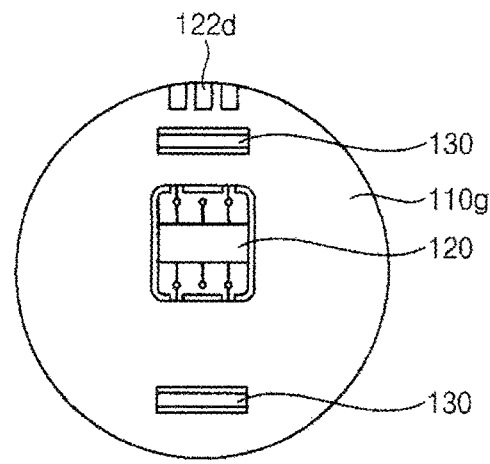
FIG. 17 is a bottom view of the memory card of FIG. 16.

Still another embodiment of a memory card in accordance with the inventive concept illustrated in FIGS. 16 and 17.

In one example of this embodiment, the memory card 100g is substantially the same as the memory card 100d of FIGS. 10-12 except for the shape of its card body. In particular, the cross section of the card body 110g of the memory card 100g is circular and hence, the memory card 100g is cylindrical. Thus, a receiving groove of the adaptor configured to receive the circular card body 110g is also cylindrical. Accordingly, the memory card 100g does not have directivity.

Furthermore, although the memory card 100g is shown as having an attachment mechanism of the type shown in and described with reference to FIGS. 1-3 (pair of magnets 130), the memory card 100g may alternatively have an attachment mechanism including a latch, i.e., the mechanical attachment mechanism 130a of the type shown in and described with reference to FIGS. 4-6.

Memory Card Adaptor

An embodiment of a memory card adaptor in accordance with the inventive concept will now be described in more detail with reference to FIGS. 18, 19 and FIG. 20.

The memory card adaptor 200 includes an adaptor body 210, a socket 220 and a lock 230.

The adaptor body 210 may be an integral part of an electronic device such as a cellular phone, notebook computer, or the like. The adaptor body 210 has a memory card-receiving recess 212 configured to receive any of the memory cards 100, 100b, 100d, 100f according to the inventive concept, shown in and described with reference to FIGS. 1-3, 6, 7, 10-12, and 14 and 15. Thus, the recess 212 has a rectangular parallelepiped shape corresponding to the shape of any of the memory cards 100, 100b, 100d, 100f. Furthermore, the recess 212 may have such a depth as to accommodate a stack of memory cards 100d or 100f. In the illustrated example of this embodiment, the adaptor 200 is sized to receive two of the memory cards 100d.

The socket 220 is exposed at the bottom of the recess 212 to engage the interface terminal 120 exposed at the lower surface of the memory card 100d. The socket 220 has a structure of contacts that complement those of the interface terminal 120. Therefore, the interface terminal 120 of the memory card 100d electrically conductively contacts the socket 220 to electrically connect the memory card 100d with the adaptor 200 and hence, connects the electronic memory of the card 100d with the electronic device that employs the adaptor 200.

The lock 230 detachably connects the memory card 100d to the adaptor body 210. As was mentioned earlier, in the case in which the attachment mechanism of the memory card 100d comprises a magnet(s), the lock 230 may comprise a magnet(s) whose pole(s) is/are oriented opposite to those of the card 100d.

Figure 20:
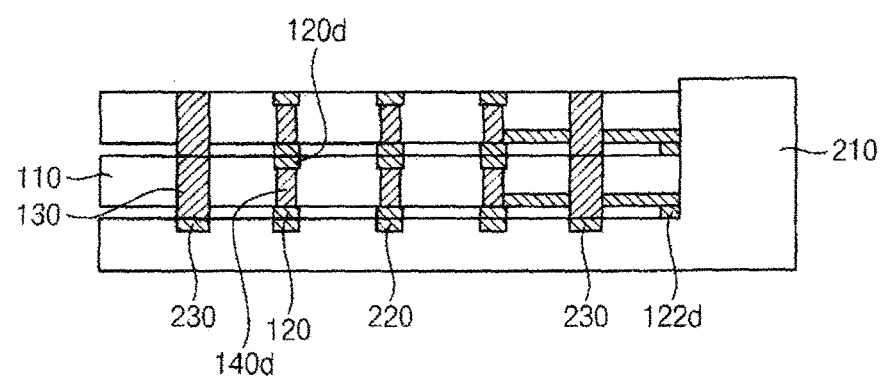
FIG. 20 is a cross-sectional view taken along line XX-XX' in FIG. 19.

As best shown in FIG. 20, when the memory cards 100d are stacked in the recess 212, the magnet(s) 130 of the upper memory card is/are magnetically attracted to the magnet(s) 130 of the lower memory card 100d to detachably fix the upper memory card to the adaptor. Furthermore, the (first) interface terminal 120 of the upper memory card contacts the second interface terminal 120d of the lower memory card 100d to electrically connect the upper memory card with the lower memory card 100d.

Figure 21:
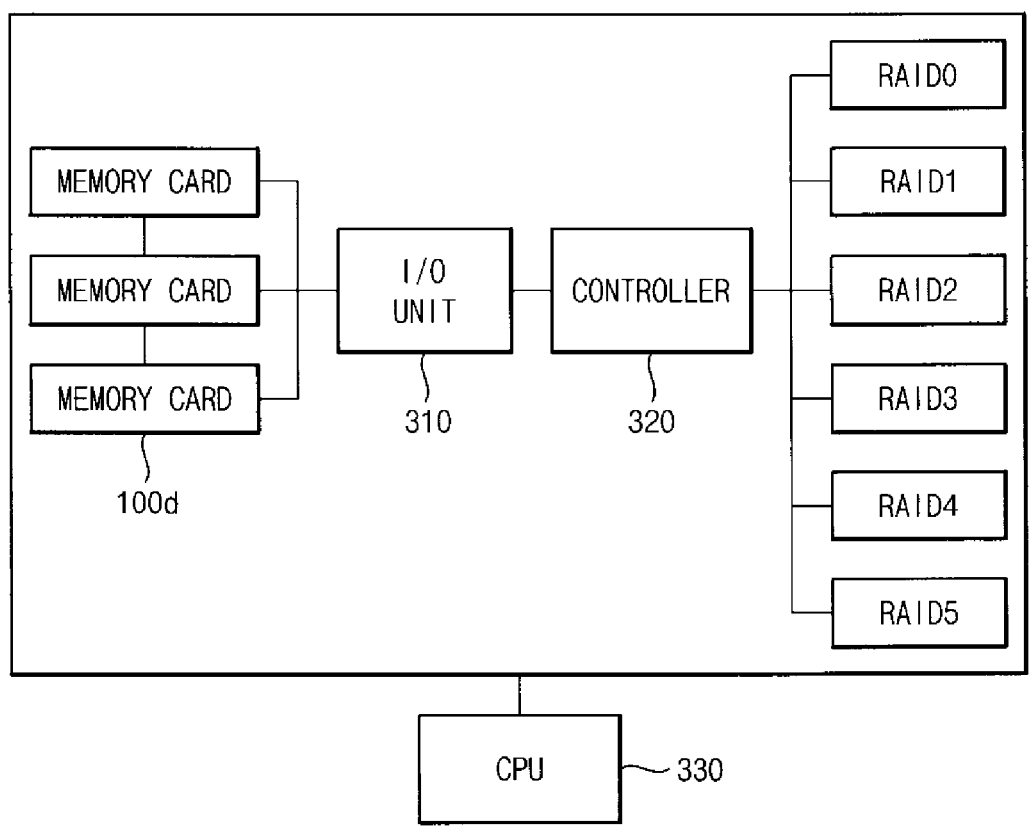
FIG. 21 is a block diagram of a system for managing data stored by memory cards received in the adaptor of FIGS. 18-20.

FIG. 21 illustrates an example of a control system for controlling data of memory cards detachably mounted to an adaptor of the type shown in and described with reference to FIGS. 18-20. However, in this example, the adaptor is sized to receive and accommodate three memory cards 100d. The control system and the adaptor may together constitute an electronic device.

The control system 300 includes an input/output (I/O) unit 310, a controller 320 and a central processing unit (CPU) 330.

The I/O unit 310 is connected to the socket of the adaptor to input/output the data into/from the memory cards 100d.

The controller 320 is connected with the I/O unit 310 to manage the data of the memory cards 100d using a redundant array of inexpensive disks (RAID). In this example, the controller 320 manages the data of the memory cards 100d in one of several ways (RAID standard levels): RAID0, RAID1, RAID2, RAID3, RAID4 and RAID5.

For example, when the controller 320 uses the level RAID0, the data is divided into three parts stored in the memory cards 100d, respectively. Thus, the data processing speed is about three times greater than in the case in which all the data had to be stored in just one card. When the controller 320 uses the level RAID1, a backup function for the data may be provided. As the RAID levels are standard schemes, no further description will be made for brevity.

Figure 22:
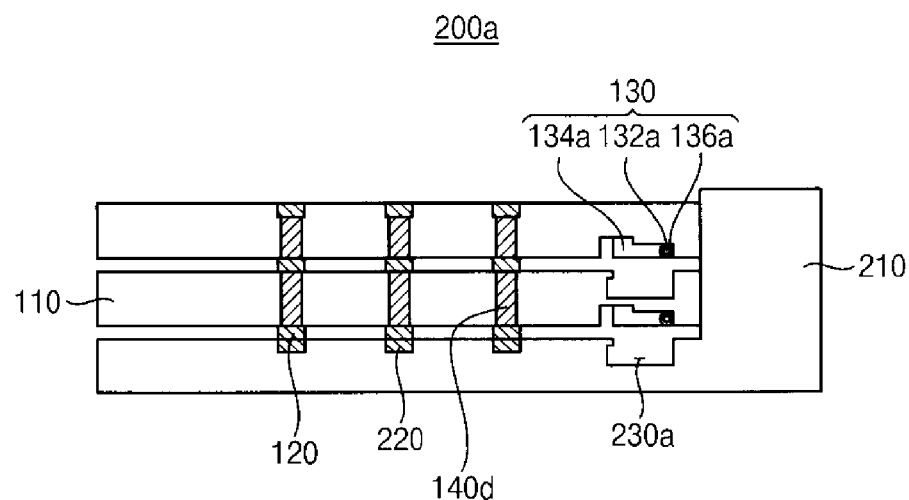
FIG. 22 is a cross-sectional view of another embodiment of a memory card adaptor in accordance with the inventive concept.

FIG. 22 illustrates another embodiment of a memory card adaptor in accordance with the inventive concept.

Figure 18:
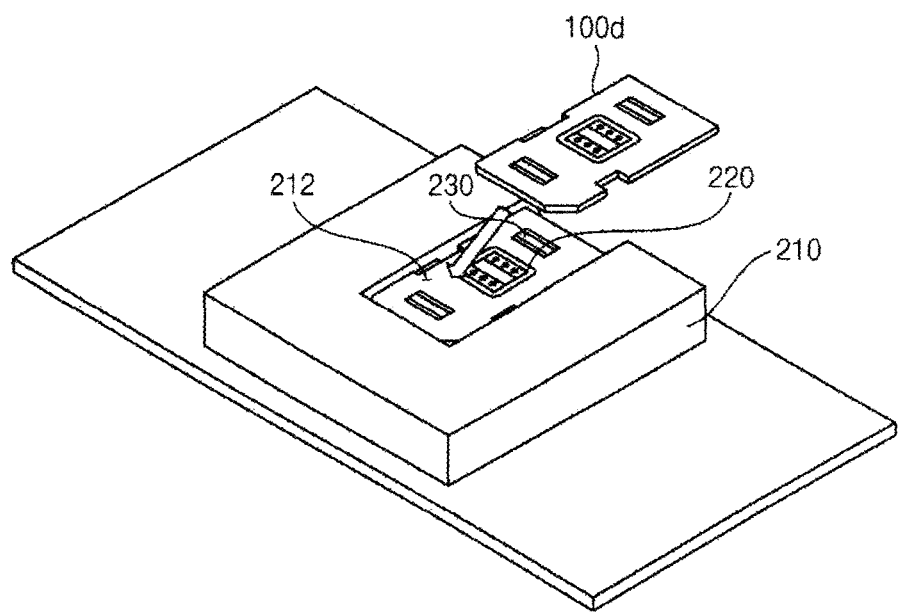
FIGS. 18 and 19 are perspective views of an embodiment of a memory card adaptor in accordance with the inventive concept.
Figure 19:
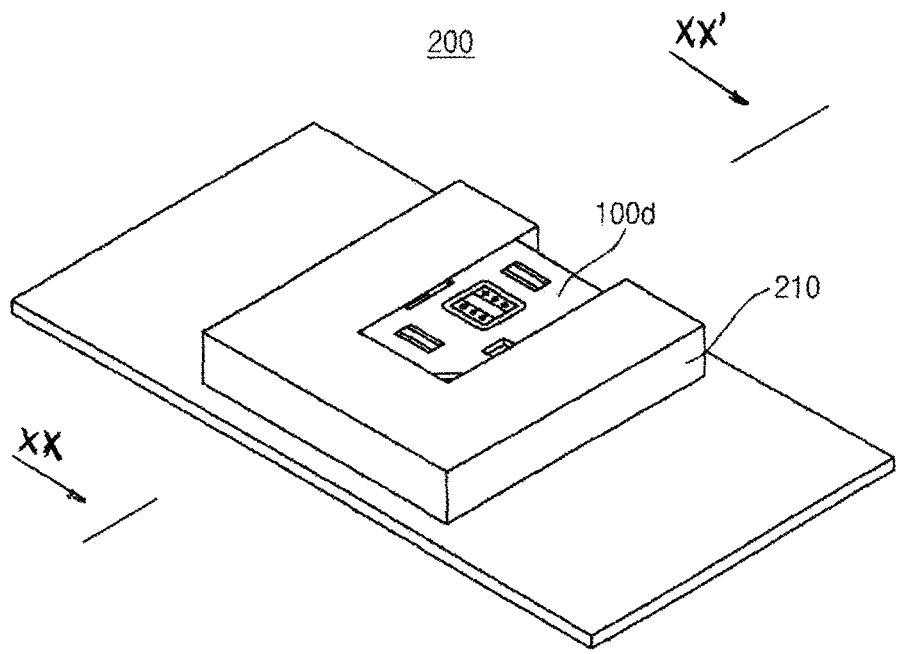

The adaptor 200a is substantially the same as the adaptor 200 of FIGS. 18-20 except for its lock.

More specifically, the lock of the adaptor is a tab defined by a locking groove 230a in the surface of the adaptor body 210 that defines the bottom of the card-receiving recess (of the type designated by reference number 212 in FIG. 18). The card-receiving recess is sized to receive one or more memory cards 100e of the type shown in and described with reference to FIG. 13. Thus, the memory card 100e may be fixed to the adaptor 200a by inserting the latch 134a of the memory card 100e into the locking groove 230a and engaging the tab with the latch 134a.

Furthermore, as shown in FIG. 22, in the case in which the adaptor 200a is sized to two or more memory cards 200e, at least the lower ones of the memory cards is/are additionally provided with a tab corresponding to that of the lock of the adaptor 200a. As illustrated in FIG. 22, in the case in which the adaptor 200a is sized to receive two memory cards 200e, the upper memory card 100e may be firmly secured to the lower memory card 100e by inserting the latch of the upper memory card into the receiving groove of the lower memory card 100e and engaging the tab of the lower memory card 100e with the latch of the upper memory card.

Figure 23:
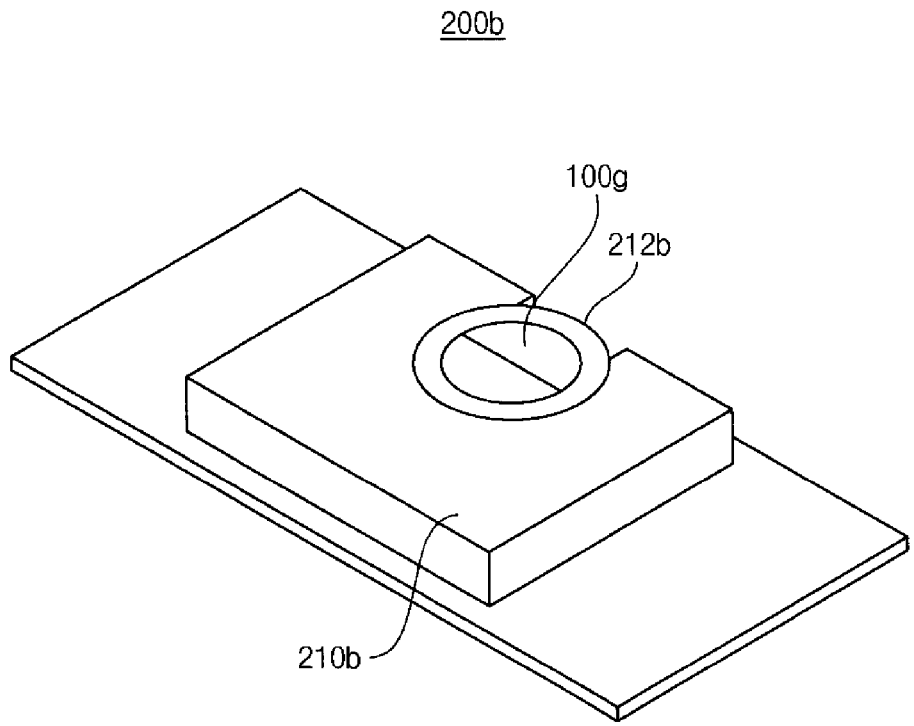
FIG. 23 is a perspective view of still another embodiment of a memory card adaptor in accordance with the inventive concept.

Another embodiment of a memory card adaptor is illustrated in FIG. 23.

This memory card adaptor 200b is substantially the same as the adaptor 200 of FIGS. 18-20 except for the shape of the card-receiving recess.

Specifically, the adaptor body 210b has a cylindrical card-receiving recess 212b adapted to receive one or more of the circular memory cards 100g of FIG. 16. As mentioned above, the circular memory card 100g does not have the directivity so that one or more of the circular memory cards 100g may be readily inserted into the cylindrical recess 212b.

According to an aspect of the inventive concept as described above, the interface terminal of the memory card is disposed at a central portion of the card body. Furthermore, a complementary socket is disposed at the bottom of the card-receiving recess of the adaptor. Thus, the memory card may be loaded into the adaptor flat side down (i.e., with one of its major surfaces facing toward the adaptor). Therefore, the memory card may be inserted into the adaptor without having to remove a battery from a device, such as a cellular phone, which employs the adaptor. According to another aspect of the inventive concept, similar interface terminals are exposed at both major surfaces of the card body, respectively, such that a number of the memory cards may be stacked in the adaptor. According to yet another aspect of the inventive concept, the memory card and its adaptor may each have a circular cross section such that the memory card may be readily inserted into the adaptor.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A memory card comprising:
    a card body having first and second oppositely facing major surfaces, and an outer peripheral side edge interposed between the first and second major surfaces, and an electronic memory enclosed by the card body as sandwiched between the first and second major surfaces of the card body and surrounded by the outer peripheral side edge of the card body;
    an interface terminal exposed at a central portion of the first major surface of the card body and electrically connected to the memory;
    an attachment mechanism, by which the card is to be detachably connected to an electronic device, disposed at an outer peripheral portion of the first major surface of the card body that surrounds the central portion; and
    an auxiliary interface terminal disposed at the outer periphery of the card body.

2. The memory card of claim 1, wherein the card body has a circular cross-sectional shape.

3. The memory card of claim 1, wherein the attachment mechanism comprises a hinge pin supported by the card body, and a latch mounted to the hinge pin, and the card body defines a locking groove in the first major surface and in which the latch is received.

4. The memory card of claim 1, wherein the interface terminal exposed at the first major surface is a first interface terminal of the card, and the card further comprises a second interface terminal exposed at a central portion of the second major surface of the card body and also electrically connected to the memory contained in the card body.

5. The memory card of claim 4, further comprising a conductor extending in the card body and electrically connecting the first and second interface terminals directly with each other.

6. The memory card of claim 1, wherein the attachment mechanism comprises at least one magnet.

7. The memory card of claim 6, wherein the attachment mechanism comprises a pair of the magnets disposed symmetrically with respect to the interface terminal.

8. The memory card as claimed in claim 1 in combination with an electronic device,
    wherein the electronic device comprises a memory card adaptor configured to receive the memory card,
    the memory card adaptor comprises an adaptor body having an upper surface and a card-receiving recess in the upper surface, an electrical socket exposed at a central portion of a surface of the adaptor body that defines the bottom of the card-receiving recess, and a lock integral with the adaptor body and disposed at an outer peripheral portion of the upper surface of the adaptor body that defines the bottom of the card-receiving recess,
    the card-receiving recess has a cross-sectional shape corresponding to the shape of the first major surface of the card body of the memory card, and the memory card is received in the card-receiving recess with the first major surface of the card body facing the bottom of the card-receiving recess,
    the lock and the attachment mechanism coact to detachably secure the memory card to the adaptor body within the card-receiving recess, and
    the socket electrically conductively contacts the interface terminal of memory card.

9. The combination of claim 8, wherein the memory card and the card-receiving recess of the adaptor are each cylindrical.

10. The combination of claim 8, wherein the attachment mechanism comprises at least one magnet.

11. The combination of claim 8, wherein the attachment mechanism of the memory card comprises a hinge pin supported by the card body, and a latch mounted to the hinge pin, and the lock of the adaptor comprises a tab at the bottom of the card-receiving recess.

12. The combination of claim 8, wherein the memory card is a lower memory card and further comprises a second interface terminal exposed at a central portion of the second major surface of the card body and also electrically connected to the memory contained in the card body, and further comprising an upper memory card received in the card-receiving recess of the adaptor body and stacked on the lower memory card, and wherein the upper memory card has an interface terminal electrically conductively contacting the second interface terminal of the lower memory card, and an attachment mechanism that detachably secures the upper memory card to the lower memory card.

13. The combination of claim 12, further comprising a conductor extending in the card body of the lower memory card and electrically connecting the interface terminals of the lower memory card directly with each other.

14. A memory card comprising:
    a card body containing an electronic memory of the card, the card body having first and second oppositely facing major surfaces, and an outer peripheral side edge interposed between the first and second major surfaces;
    an interface terminal exposed at a central portion of the first major surface of the card body and electrically connected to the memory; and
    at least one magnet, by which the card is to be detachably connected to an electronic device, disposed at an outer peripheral portion of the first major surface of the card body that surrounds the central portion.

15. The memory card of claim 14, wherein the at least one magnet comprises a pair of the magnets disposed symmetrically with respect to the interface terminal.

16. The memory card as claimed in claim 14 in combination with an electronic device,
    wherein the electronic device comprises a memory card adaptor configured to receive the memory card,
    the memory card adaptor comprises an adaptor body having an upper surface and a card-receiving recess in the upper surface, an electrical socket exposed at a central portion of a surface of the adaptor body that defines the bottom of the card-receiving recess, and a lock integral with the adaptor body and disposed at an outer peripheral portion of the upper surface of the adaptor body that defines the bottom of the card-receiving recess, the card-receiving recess has a cross-sectional shape corresponding to the shape of the first major surface of the card body of the memory card, and the memory card is received in the card-receiving recess with the first major surface of the card body facing the bottom of the card-receiving recess, the lock comprises at least one magnetic element that coacts with the at least one magnet of the memory card to detachably secure the memory card to the adaptor body within the card-receiving recess, and the socket electrically conductively contacts the interface terminal of memory card.

17. A memory card comprising:

a card body containing an electronic memory of the card, the card body having first and second oppositely facing major surfaces, and an outer peripheral side edge interposed between the first and second major surfaces, and defining a locking groove in the first major surface;

an interface terminal exposed at a central portion of the first major surface of the card body and electrically connected to the memory; and an attachment mechanism, by which the card is to be detachably connected to an electronic device, disposed at an outer peripheral portion of the first major surface of the card body that surrounds the central portion, wherein the attachment mechanism comprises a hinge pin supported by the card body, and a latch mounted to the hinge pin and received in the locking groove of the card body.

18. The memory card as claimed in claim 17 in combination with an electronic device, wherein the electronic device comprises a memory card adaptor configured to receive the memory card, the memory card adaptor comprises an adaptor body having an upper surface and a card-receiving recess in the upper surface, an electrical socket exposed at a central portion of a surface of the adaptor body that defines the bottom of the card-receiving recess, and a lock integral with the adaptor body and disposed at an outer peripheral portion of the upper surface of the adaptor body that defines the bottom of the card-receiving recess, the card-receiving recess has a cross-sectional shape corresponding to the shape of the first major surface of the card body of the memory card, and the memory card is received in the card-receiving recess with the first major surface of the card body facing the bottom of the card-receiving recess, the lock coacts with the latch of the attachment mechanism of the memory card to detachably secure the memory card to the adaptor body within the card-receiving recess, and the socket electrically conductively contacts the interface terminal of memory card.

* * * * *